US008296710B2

(12) United States Patent
Liu et al.

(10) Patent No.: US 8,296,710 B2
(45) Date of Patent: Oct. 23, 2012

(54) SOFT CONSTRAINTS IN SCHEDULING

(75) Inventors: Bin Liu, Los Angeles, CA (US); Zhiru Zhang, Los Angeles, CA (US); Jason Cong, Pacific Palisades, CA (US)

(73) Assignee: Xilinx, Inc., San Jose, CA (US)

( * ) Notice: Subject to any disclaimer, the term of this patent is extended or adjusted under 35 U.S.C. 154(b) by 189 days.

(21) Appl. No.: 12/845,204

(22) Filed: Jul. 28, 2010

(65) Prior Publication Data

US 2011/0029942 A1 Feb. 3, 2011

Related U.S. Application Data

(60) Provisional application No. 61/229,210, filed on Jul. 28, 2009.

(51) Int. Cl.
*G06F 17/50* (2006.01)

(52) U.S. Cl. ......... 716/132; 716/133; 716/134; 716/135

(58) Field of Classification Search ........... 716/132–135
See application file for complete search history.

(56) References Cited

U.S. PATENT DOCUMENTS

| | | | | |
|---|---|---|---|---|
| 6,826,733 | B2 * | 11/2004 | Hathaway et al. | 716/134 |
| 7,124,377 | B2 * | 10/2006 | Catthoor et al. | 716/102 |
| 7,831,951 | B2 * | 11/2010 | Catthoor et al. | 716/104 |
| 8,091,060 | B1 * | 1/2012 | Tom et al. | 716/121 |
| 2007/0245273 | A1 * | 10/2007 | Catthoor et al. | |
| 2009/0319253 | A1 * | 12/2009 | Phillips et al. | 703/16 |

OTHER PUBLICATIONS

Liu et al.; "Power-aware scheduling under timing constraints and slack analysis for mission-critical embedded systems"; Mar. 15, 2001; Dept. of Electrical & Computer Engineering University of California; Irvine, CA, USA; pp. 1-25.*
Cong et al.; "An Efficient and Versatile Scheduling Algorithm Based on SDC Formulation"; DAC 2006; Jun. 24-28, 2006; San Francisco, California, USA; pp. 433-438.*
Bertsekas, Dimitri P., *Nonlinear Programming*, Sep. 1, 1999, pp. 276-283, $2^{nd}$ Edition, Athena Scientific, Nashua, New Hampshire, USA.
Bistarelli, Stefano et al., "Soft Constraint Propagation and Solving in CHRs," *Proc. of the 2002 ACM Symposium on Applied Computing*, Mar. 11, 2002, pp. 1-5, ACM, New York, New York, USA.

(Continued)

*Primary Examiner* — Naum Levin
(74) *Attorney, Agent, or Firm* — Richard L. Gregory; Gerald Chan (57) ABSTRACT

A method for implementing soft constraints in scheduling comprises receiving a description of circuit behavior. The description is un-timed. A scheduling solution is generated for use in scheduling the description. The scheduling solution includes scheduling variables and an objective function. The scheduling variables schedule the time of at least one operation. The objective function includes a penalty term and constraints comprising at least one hard constraint and at least one soft constraint. The constraints are created on the scheduling variables. The penalty term comprises a slack variable representing violations of the constraints. The penalty term measures the design cost of violating the soft constraint. Following generation of the scheduling solution, the description is scheduled by applying the scheduling solution to the description. Timing information of the description is provided as an output of the scheduling.

19 Claims, 6 Drawing Sheets

OTHER PUBLICATIONS

Cong, Jason et al., "Scheduling with Soft Constraints," Nov. 2, 2009, pp. 47-54, *2009 IEEE/ACM International Conference on Computer-Aided Design Digest of Technical Papers*, ACM, New York, New York, USA.

Cong, Jason et al., "An Efficient and Versatile Scheduling Algorithm Based on SDC Formulation," *Proc. of the 43rd Design Automation Conference*, Jun. 24, 2006, pp. 1-6, ACM, New York, New York, USA.

Monteiro, Jose et al., "Scheduling Techniques to Enable Power Management," *Proc. of the 33$^{rd}$ Design Automation Conference*, Jun. 3, 1996, pp. 1-4, ACM, New York, New York, USA.

Zhu, Jianwen et al., "Soft Scheduling in High Level Synthesis," *Proc. of the 36$^{th}$ Design Automation Conference*, Jun. 25, 1999, pp. 1-6, ACM, New York, New York, USA.

\* cited by examiner

SOFT CONSTRAINTS IN SCHEDULING

RELATED APPLICATIONS

This application claims the benefit of U.S. Patent Application No. 61/229,210, filed Jul. 28, 2009

TECHNICAL FIELD

The disclosure herein relates generally to circuit design and, in particular, to systems and methods for scheduling in a high-level synthesis flow used in circuit design.

BACKGROUND

Figure 1:
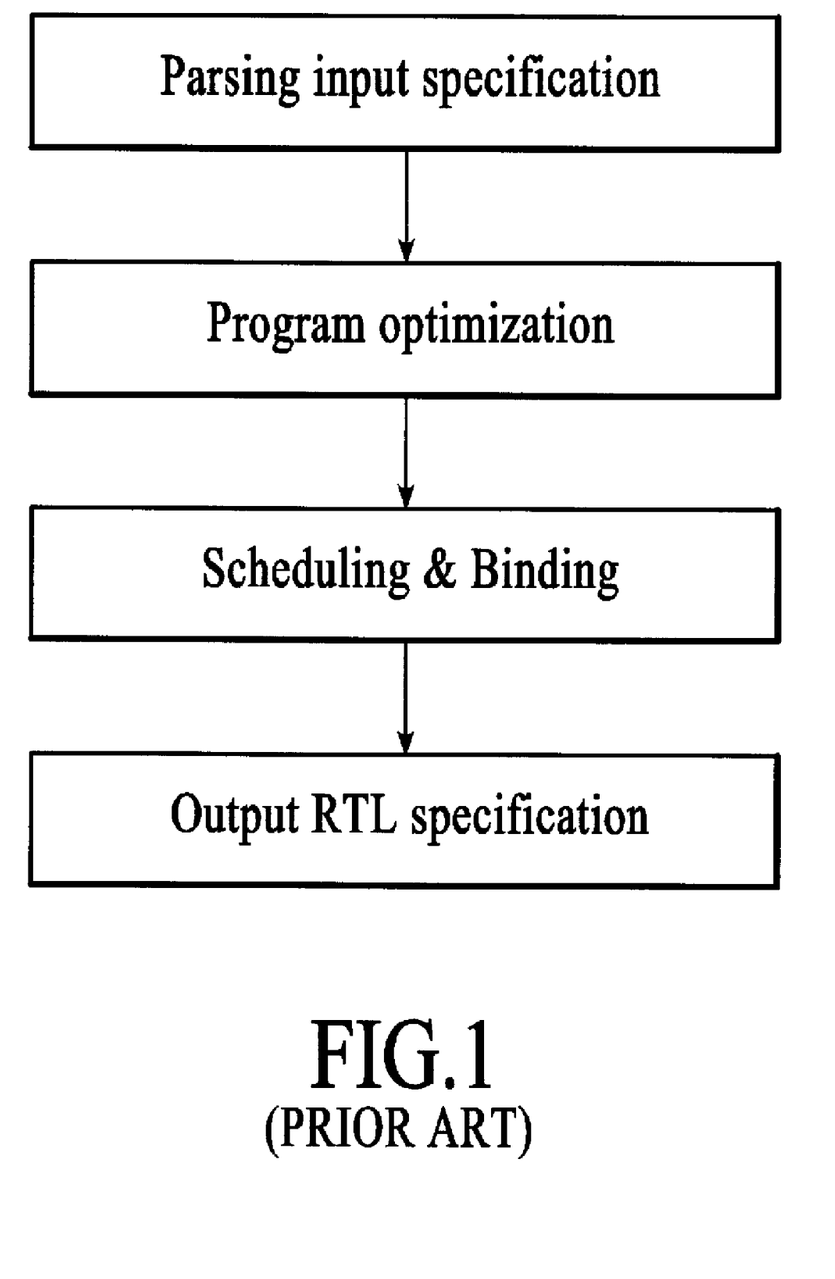
FIG. 1 is a flow diagram of a conventional high-level synthesis method under the prior art.

High-level synthesis is the process of transforming an untimed description of circuit behavior (in programming languages like C or others) of a circuit design (e.g., Very Large Scale Integration (VLSI) circuit) to a cycle-accurate Register Transfer Level (RTL) description of the design (in programming languages like SystemC, VHDL, Verilog, etc.). FIG. 1 is a flow diagram of a conventional high-level synthesis method under the prior art, where code transformation is performed to optimize input code, scheduling assigns operations to control states and binding assigns operations to functional units, variables to storage elements, and data transfers to interconnects.

Scheduling is a critical and complex component of high-level synthesis because many important aspects relating to the final implementation of a circuit design, including performance, area, power, reliability, yield, etc., are largely influenced by the quality of scheduling.

Designers or tools, in generating the scheduling for a circuit design, typically impose constraints to state the necessary requirement of the design. Some of these constraints are necessary in order to guarantee the resulting circuit is functionally correct, like data dependency constraint, or input/output protocol requirement. Notably, many other constraints are not actually strict in that these constraints are preferably followed but not necessarily, as they are not essential to a correct implementation. In fact, many practical designs are under conflicting constraints which cannot be satisfied simultaneously. For example, a target frequency and a latency constraint may be specified at the same time, but the target frequency might be too high to meet given the target platform. The conventional method used in scheduling has clearly defined constraints, which are hard constraints. These constraints are hard constraints because even a slight violation of any constraint is considered unacceptable by a typical solver for scheduling. If two hard constraints contradict each other, the conventional problem solver either stops solving and reports a failure, or discards one of the constraints completely. In the later case, the order in which constraints are processed can be a significant factor in deciding the final solution.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

DETAILED DESCRIPTION

Scheduling is a critical and complex task in high-level synthesis, and efforts are needed in the scheduler to consider or implement multiple constraints. Embodiments described herein use soft constraints along with hard constraints to specify the direction for optimization within a large and complex design space. Soft constraints, as used herein, are constraints that are allowed to be violated, but should be satisfied if/where possible. Soft constraints do not over-restrict the feasible design space and thus do not cause inconsistency even with multiple and somewhat contradicting design intents, which frequently arise in real-world designs. Methods are described below for implementing soft constraints in a mathematical programming formulation for scheduling. Penalty functions are used to address soft constraints in the methods of an embodiment.

The soft constraints of an embodiment include a special class of penalty functions in mathematical programming. The soft constraints enable implementation of a number of design intents in scheduling without introducing inconsistencies, making the soft constraints an effective way to guide the scheduler in a complex design space. The soft constraints make it possible to simultaneously consider all potential optimization directions for a circuit design, and enable exploration of the design space by varying the penalty function for each individual soft constraint.

In the following description, numerous specific details are introduced to provide a thorough understanding of, and enabling description for, embodiments of the inspection systems and methods. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

Figure 2A:
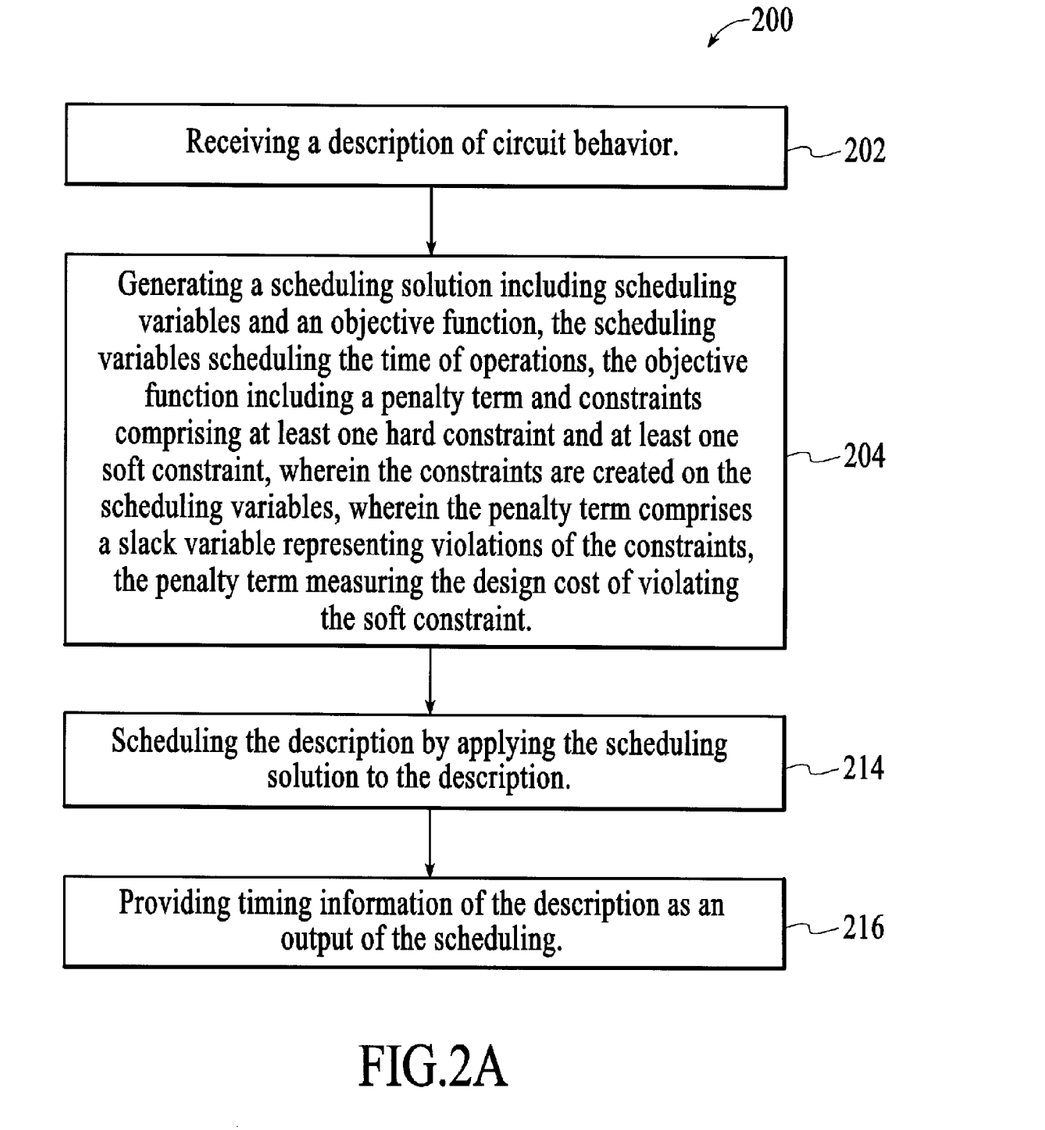
FIG. 2A is a flow diagram for using soft constraints in scheduling in high-level synthesis, under an embodiment.

FIG. 2A is a flow diagram for using soft constraints in circuit design behavioral synthesis, under an embodiment. Embodiments described herein include a method comprising receiving a description of circuit behavior 202, where the description is un-timed. A scheduling solution is generated for use in scheduling the description 204. The scheduling solution includes scheduling variables and an objective function. The scheduling variables schedule the time of at least one operation. The objective function includes a penalty term and constraints comprising at least one hard constraint and at least one soft constraint. The constraints are created on the scheduling variables. The penalty term comprises a slack variable representing violations of the constraints. The penalty term measures the design cost of violating the soft constraint. Following generation of the scheduling solution, the description is scheduled by applying the scheduling solution to the description 214. Timing information of the description is provided as an output of the scheduling 216.

Figure 2B:
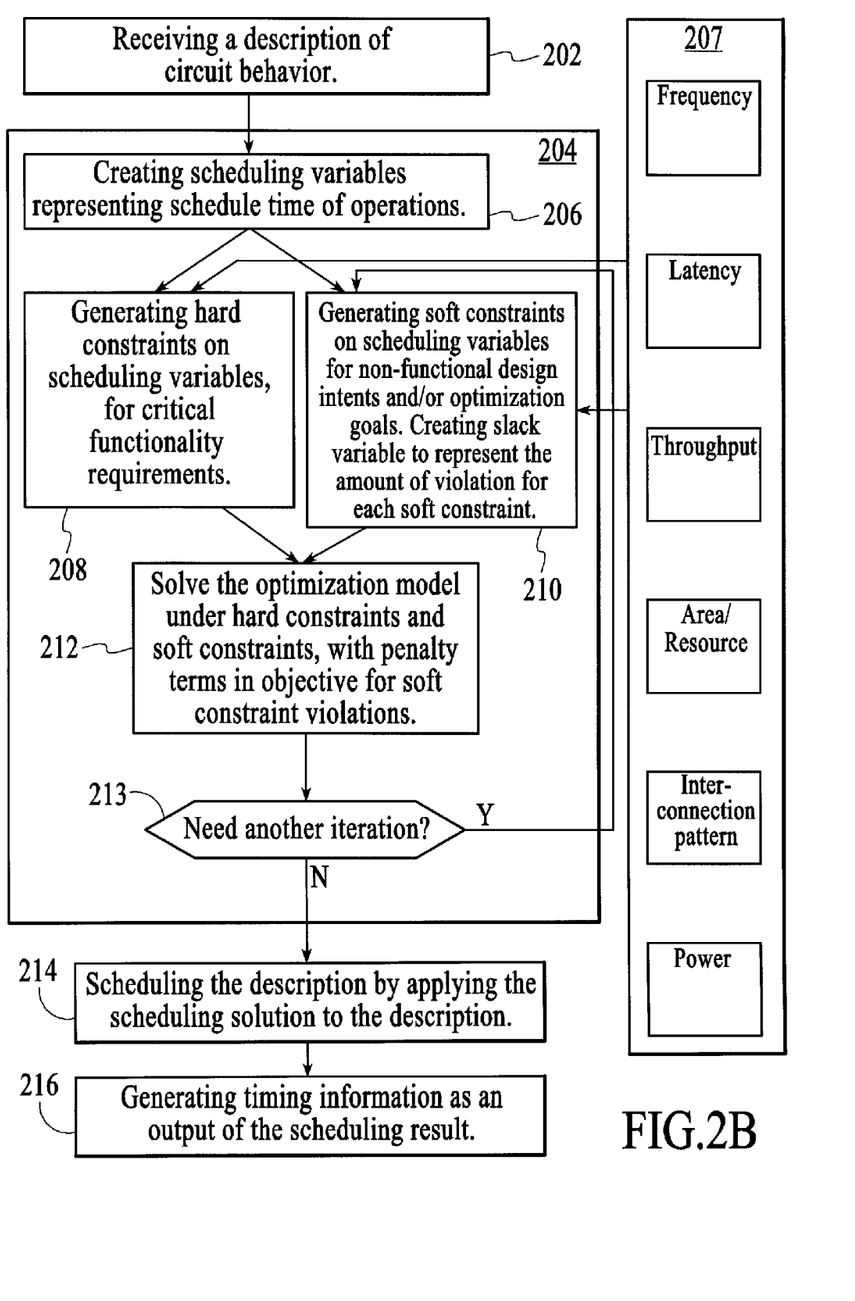
FIG. 2B is a more specific flow diagram for using soft constraints in scheduling in high-level synthesis, under an embodiment.

FIG. 2B is a flow diagram for using soft constraints in circuit design high-level synthesis, under an embodiment. Embodiments described herein include a method comprising receiving a description of circuit behavior 202, where the description is un-timed. A scheduling solution is generated for use in scheduling the description 204. Scheduling variables representing the schedule time of numerous operations are created as solution representation 206. Hard constraints are created on scheduling variables for critical functionality requirements 208. Soft constraints are created on scheduling variables for non-functional design intents (or preferences for optimization purposes), together with slack variables representing the constraint violations. Both hard constraints and soft constraints are based on the input behavior and various specifications for target quality of result, including, but not limited to, frequency, latency, throughput, area, resource, interconnection pattern, and power 207. A slack variable 210 is used in a penalty term in an objective function. The objective function represents the design optimization goal and is constrained by at least one hard constraint and at least one soft constraint. The penalty term represents a design cost of violating the soft constraint. The problem is solved with an optimization engine 212. The solution is evaluated and a decision is made on whether existing soft constraints need adjustment in the next iteration 213. If so, at least one iteration is performed, where soft constraints are adjusted based on the existing solution and the design requirements before the optimization engine is invoked again in 212. Following generation of the scheduling solution, the description is scheduled by applying the scheduling solution to the description 214. Timing information of the description is generated as an output of the scheduling 216.

Embodiments described herein are provided for scheduling a high-level synthesis flow in VLSI circuit design, where high-level synthesis refers to the process of transforming an untimed description of the circuit behavior to a cycle-accurate RTL description of the design. Scheduling is a critical and complex task in high-level synthesis, as many important aspects relating to the final implementation, including performance, area, power, reliability, yield, etc., are largely influenced by the quality of scheduling. Designers or tools typically impose constraints to state the necessary requirements of the design. Notably, many such constraints are not actually strict, because they are preferably but not necessarily followed because they are not essential to a correct implementation of the circuit design. In fact, many practical designs are under contradicting constraints which cannot be satisfied simultaneously.

For example, a target frequency and a latency constraint may be specified for a circuit design at the same time, but the target frequency might be too high to meet given the target platform. The soft constraints of an embodiment can be introduced in such a situation to make distinctions between constraints that are essential (hard constraints) and preferential constraints (soft constraints) (See S. Bistarelli, T. Frühwirth and M. Marte., "Soft constraint propagation and solving in CHRs," in *Proc. ACM Symp. Applied Computing*, 2002). In the example, one solution is to specify target frequency as a soft constraint and slightly increase the estimated cycle time in the solution. This solution may lead to a lower than specified frequency, but it is better than disregarding the constraint completely. Moreover, it might still be possible to meet the target frequency in the final implementation of the design, because the estimation model for frequency used in scheduling is usually less accurate than that used after backend design because many techniques for timing optimization (e.g., logic optimization, retiming, gate sizing, placement, buffer insertion, etc.) can be applied at later design stages to improve frequency.

The soft constraints of an embodiment do not introduce inconsistencies to the constraint system. If two hard constraints contradict each other, the problem solver of an embodiment either stops solving and reports failure, or discards one of the constraints completely. In the later case, the order in which constraints are processed can be a significant factor in deciding the final solution. On the other hand, even if two or more soft constraints suggest somewhat contradicting optimization directions, a feasible solution is still possible and many soft constraints can probably be addressed.

Conventional methods allow early scheduling decisions to be changed in later steps in an iterative optimization process for scheduling (see, for example, J. Zhu and D. D. Gajski, "Soft scheduling in high level synthesis," in *Proc. Design Automation Conf.*, 1999). The method of an embodiment is different from those conventional methods in that the method of an embodiment is not dependent on an iterative algorithm, and it is possible to make decisions while simultaneously considering all constraints.

In one embodiment, mathematical programming is used to formulate and to solve the problem. Mathematical programming is a powerful tool for modeling and solving the scheduling problem (see, for example, J. Cong and Z. Zhang, "An efficient and versatile scheduling algorithm based on SDC formulation," in *Proc. Design Automation Conf.*, 2006). In a typical formulation with natural-time representation of the scheduling solution, variables are introduced for each operation (or computational task) in the CDFG to represent the time when the operation is scheduled to start. Other variables are also allowed based on design considerations and models used in scheduling. Let $s_v$ be the starting time of operation v, then the time distance between two operations u and v can be expressed as $s_v - s_u$; more complex relationships between scheduling variables and other variables can also be captured using such a representation.

Conventional forms of mathematical programming have clearly defined constraints, which are hard constraints. Even a slight violation of any constraint is considered unacceptable by a typical solver for a mathematical program. The way soft constraints are implemented in the system of an embodiment is through use of penalty functions, but the embodiment is not so limited. For example, a general problem with soft constraints is specified in an embodiment as minimize $f(x)$ objective function subject to $g_i(x) \leq 0, i=1, \ldots, m$ hard constraints $$h_i(x) \leq 0, i=1, \ldots, n \text{ soft constraints} \quad (1)$$

For a soft constraint $h_i(x) \leq 0$, a slack variable $r_i$ is introduced, and the soft constraint is transformed into conventional constraint as $$h_i(x) \leq r_i \quad (2)$$

$$r_i \geq 0 \quad (3)$$

A penalty term $p_i(r_i)$ is also added in the objective function to represent the cost if $r_i$ is not 0. Therefore, $p_i(x)$ is supposed to be 0 if x is 0, and is a monotonically non-decreasing function of x when x≧0, but not necessarily. The form of the penalty function can be very flexible, and in an embodiment the form of the penalty function can be linear, piece-wise linear, quadratic, hyperbolic, exponential, to name a few. Use of the penalty term transforms the problem into $$\text{minimize } f(x) + \sum_{i=1}^{n} p_i(r_i) \quad (4)$$
$$\text{subject to } g_i(x) \leq 0, i = 1, \ldots, m$$
$$h_i(x) \leq r_i, i = 1, \ldots, n$$
$$r_i \geq 0$$

Figure 3:
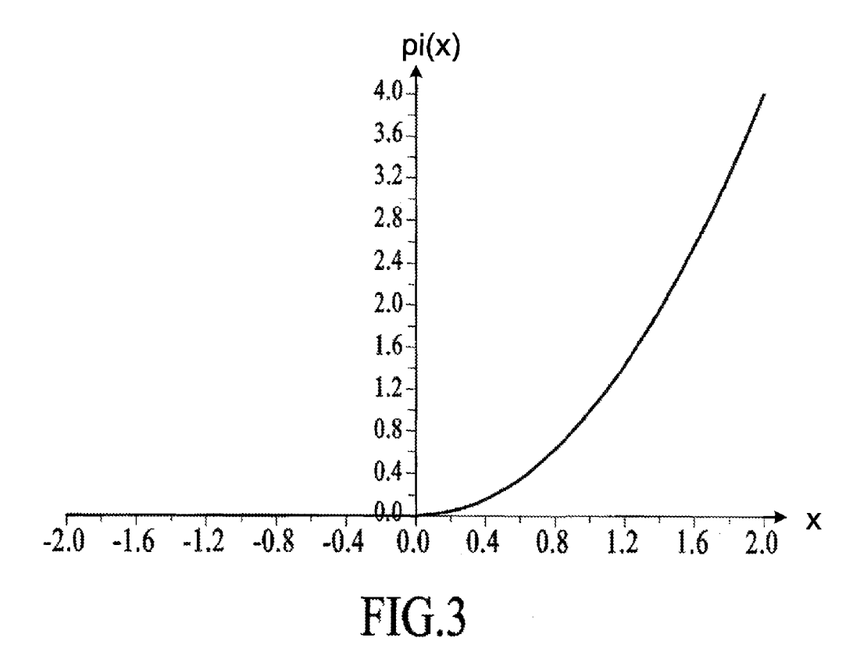
FIG. 3 is a plot of a quadratic penalty term for constraint violation, under an embodiment.

For illustrative purposes, $p_i(x)$ can be selected to be a quadratic function of x when x is positive, i.e., $$p_i(x) = \begin{cases} 0 & x \leq 0, \\ c_i x^2 & \text{otherwise}, \end{cases}$$

where $c_i$ is a positive constant, which is selected according to the cost of violating a constraint and can be estimated either automatically based on some decision system or by the designer. FIG. 3 is a plot of a quadratic penalty term for constraint violation, under an embodiment.

Following are applications of the use of soft constraints. It is understood that the embodiments described herein are not limited to such applications.

Figure 4:
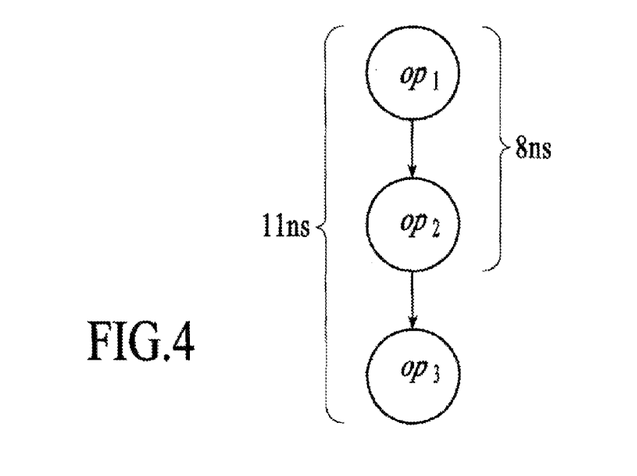
FIG. 4 is a diagram showing a path in a data-flow graph, which is used as an example to describe the application of soft constraint for target frequency, under an embodiment.

When considering the use of constraints for frequency optimization, the scheduler often tries to optimize frequency (or equivalently, cycle time, or slack time) of a circuit, or tries to meet the frequency (or equivalently, cycle time, or slack time) constraint under other constraints, such as total latency, throughput, dependency, etc. In such a case, the decision whether consecutive operations can be chained influences frequency greatly. Here chaining refers to the technique that executes two or more operations with data dependency in one clock cycle. FIG. 4 shows a path comprising operations $\{op_1, op_2, op_3\}$ in the data-flow graph. Suppose the total delay of $op_1$ and $op_2$ is 8 ns, when they are chained in the same clock cycle, and the total delay of $op_1$, $op_2$, and $op_3$ is 11 ns, when they are chained in the same clock cycle. If the objective is to meet a target frequency of 100 Mhz, the cycle time should be no longer than 10 ns. Then, $op_1$ and $op_3$ are preferably separated, which can be expressed as a hard constraint in the following.

$$s_3 \geq s_1 + 1 \quad (5)$$

However, constraints in the form of equation 5 often lead to inconsistency when a total latency constraint (or other constraints) is enforced. By substituting hard constraints in equation 5 with soft constraints, the final decision on chaining will adapt to other constraints, and different chaining schemes can be used by modifying a latency constraint. The soft constraint is like the following.

$$s_3 + r \geq s_1 + 1 \quad (6)$$

$$r \geq 0 \quad (7)$$

Here r is the slack variable which measures the amount of violation. A term p(r) is added to the objective function; the coefficient for this term can be relatively large to reduce negative-slack when possible.

Another example of the use of soft constraints comprises resource optimization, including the reuse of components, or resource sharing, under an embodiment. To allow sharing of functional units among several operations of the same type, these operations are scheduled into different steps. However, due to other considerations like performance, complete separation is often infeasible. An embodiment uses soft constraints to guide the scheduler to schedule operations that are intended to be shared into different clock cycles if possible.

Figure 5:
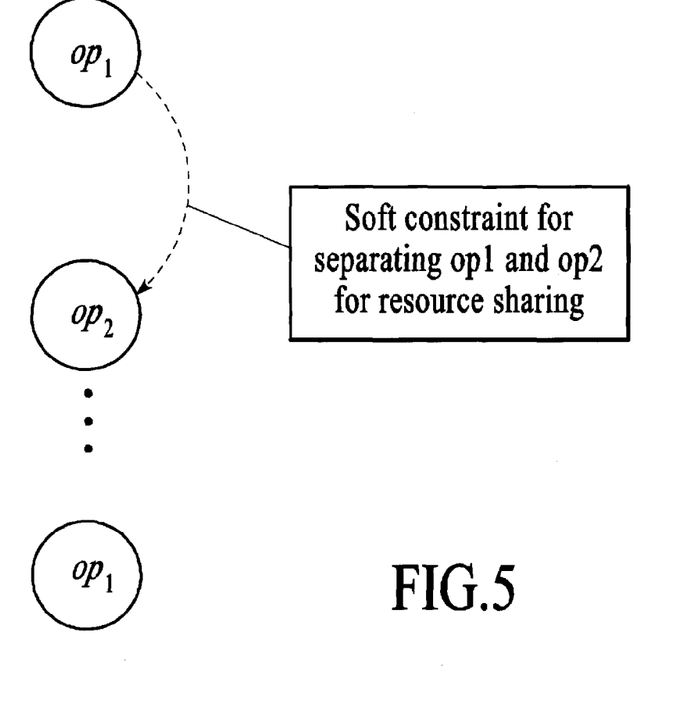
FIG. 5 is a diagram showing a part of a data-flow graph, which is used as an example to describe the application of soft constraint for resource sharing, under an embodiment.

Suppose $\{op_1, op_2, \ldots, op_k\}$ is a set of operations that preferably share the same functional unit, then a technique (see, for example, J. Cong and Z. Zhang, "An efficient and versatile scheduling algorithm based on SDC formulation," in *Proc. Design Automation Conf.*, 2006) can be applied to make it easier to add constraints to get a linear ordering of the operations based on heuristics or based on existing schedule. In one embodiment, as-soon-as-possible (ASAP) scheduling solution can be used as a reference, and the operations are ordered based on their ordering in the ASAP scheduling solution, and operation ID is used for tie breaking. In another embodiment, the as-late-as-possible (ALAP) scheduling solution is used as a reference. Other embodiments using other metrics, such as register lifetime, solution generated by another scheduler, can be used, and these metrics can be combined. As shown in FIG. 5, where the set of operations $\{op_1, op_2, \ldots, op_k\}$ is ordered, an embodiment adds soft constraints as $$s_{i+1} + r_i \geq s_i + 1, i = 1, \ldots, k-1 \quad (8)$$

$$r_i \geq 0, i = 1, \ldots, k-1 \quad (9)$$

Once the above soft constraints are satisfied, $op_{i+1}$ and $op_i$ will not be scheduled in the same state, and thus resource sharing is possible.

Another example of the use of soft constraints under an embodiment includes interconnection pattern optimization. Certain patterns in the data-flow graph may preferably be scheduled in a certain manner in order to optimize the implementation and to leverage existing built-in structures on the target platform. For example, modern FPGA platforms have built-in multiply/accumulate (MAC) units, each of which is able to efficiently implement a multiplication followed by an addition. To enable the use of MAC units, soft constraints can be specified to encourage scheduling to follow such interconnection pattern so that the multiplication and the subsequent addition are scheduled in adjacent clock cycles.

Figure 6:
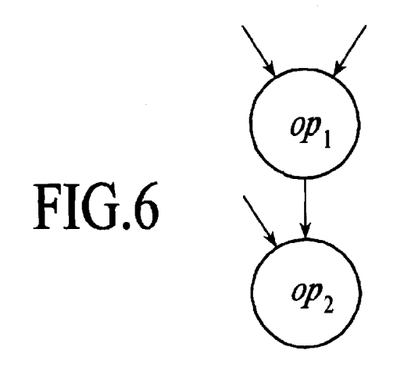
FIG. 6 is a diagram showing a part of a data-flow graph, which is used as an example to describe the application of soft constraint for handling platform-specific interconnection patterns.

In the example in FIG. 6, which shows part of a data-flow graph, suppose $op_1$ is the multiplication and $op_2$ is the addition following it; the following soft constraints are added, with $r_1$ and $r_2$ occurring in penalty terms.

$$s_1 + 1 + r_1 \geq s_2$$

$$s_2 - 1 + r_2 \geq s_1$$

$$r_1 \geq 0$$

$$r_2 \geq 0$$

When the soft constraints are satisfied, i.e., when $r_1$ and $r_2$ are both zero, $op_1$ and $op_2$ will be scheduled in adjacent clock cycles.

Yet another example of the use of soft constraints under an embodiment includes power optimization, using operation gating in one embodiment. Operation gating reduces power by shutting down part of the circuit when results produced by the corresponding operations do not influence the output (i.e., unobservable at output). Thus, it is desirable to determine the conditions for shutting down earlier, because it helps increase the number of operations to gate as well as the duration of shutting down.

Figure 7:
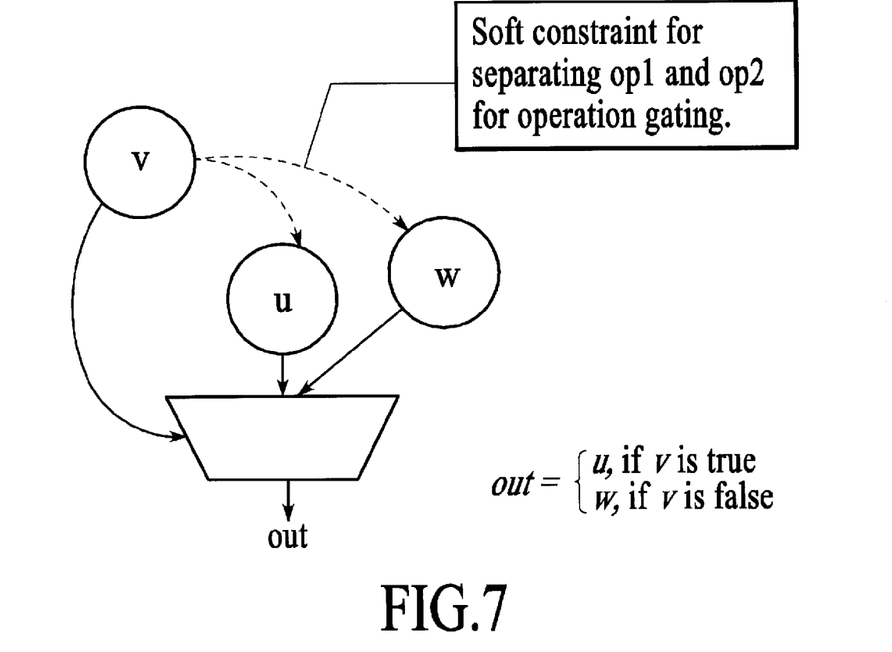
FIG. 7 is a diagram showing a part of a data-flow graph, which is used as an example to describe the application of soft constraint for operation gating, under an embodiment.

In the example in FIG. 7, suppose v is the operation whose output feeds to the control input of a multiplexer, and u is an operation that is unobservable when v is true, and w is an operation that is unobservable when v is false. Thus, it is desirable for v to be scheduled before u and w, so that correct result can be produced without either u or w, which potentially brings benefit in power/area, etc. The desired situation is reached if the following constraints are met, $$s_v \leq s_u \quad (10)$$

$$s_v \leq s_w \quad (11)$$

Both Equation 10 and 11 are converted to soft constraints, in one embodiment.

Previous work considers operations producing conditions one by one, and notes that the order in which conditions are examined could influence the quality significantly (see, for example, J. Monteiro, S. Devadas, P. Ashar and A. Mauskar, "Scheduling techniques to enable power management," in *Proc. Design Automation Conf.*, 1996). The use of soft constraints as described herein enables simultaneous consideration of all conditions.

In certain embodiments, the penalty function for violating a soft constraint is not a convex function of the amount of violation. In one embodiment, there is a constant cost for violating a soft constraint (like one in a soft constraint for operation gating); this type of penalty function is referred to as binary penalty function b(x).

$$b(x) = \begin{cases} 1 & \text{if } x > 0, \\ 0 & \text{if } x \leq 0, \end{cases}$$

With binary penalty, the mathematical programming formulation may not be solved optimally by a mathematical solver using typical nonlinear programming method (see, for example, D. Bertsekas, *Nonlinear Programming: 2nd Edition*, Athena Scientific, 1999.) in a limited time due to the intrinsic complexity of the problem. In such a case, an iterative approximation approach is used. Every soft constraint is checked with binary penalty, and the soft constraint is eliminated if it conflicts with hard constraints, as those soft constraints are never satisfiable. For the remaining soft constraints, a sequence of sub-problems is iteratively solved with slightly different convex penalty functions to gradually approximate b(x).

In one embodiment, the process comprises a sequence of iterations, where each iteration solves a problem with linear penalty functions. At iteration k, a linear function $b^k(x)$ is used to approximate b(x) near $x^{k-1}$, where $x^{k-1}$ is the amount of violation of the corresponding soft constraint in the previous iteration. That is, $$b^k(x) = \frac{x}{\max(1, x^{k-1})} \quad (12)$$

Using this approach, the penalty value matches that of the original binary penalty, upon convergence.

Figure 8:
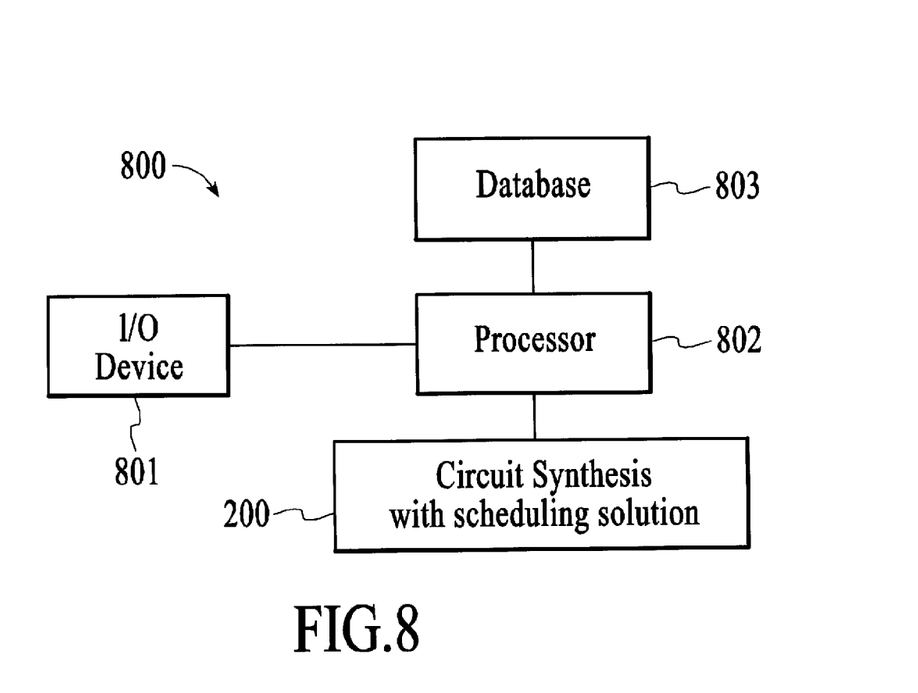
FIG. 8 is a diagram for a system for circuit synthesis with a scheduling solution.

FIG. 8 is a system for circuit synthesis with a scheduling solution as described herein. The system comprises a processor 802 coupled to a database 803 and at least one input/output (I/O) device 801. The system further comprises a method running under the processor for generating a scheduling solution 200. The method comprises receiving a description of circuit behavior, where the description is un-timed. A scheduling solution is generated for use in scheduling the description. The scheduling solution includes scheduling variables and an objective function. The scheduling variables schedule the time of at least one operation. The objective function includes a penalty term and constraints comprising at least one hard constraint and at least one soft constraint. The constraints are created on the scheduling variables. The penalty term comprises a slack variable representing violations of the constraints. The penalty term measures the design cost of violating the soft constraint. Following generation of the scheduling solution, the description is scheduled by applying the scheduling solution to the description. Timing information of the description is provided as an output of the scheduling.

Embodiments described herein include a method running on a processor, the method comprising receiving a description of circuit behavior. The description of an embodiment is un-timed. The method includes generating a scheduling solution for use in scheduling the description. The scheduling solution includes scheduling variables and an objective function. The scheduling variables schedule the time of at least one operation. The objective function includes a penalty term and constraints comprising at least one hard constraint and at least one soft constraint. The constraints are created on the scheduling variables. The penalty term comprises a slack variable representing violations of the constraints. The penalty term measures a design cost of violating the at least one soft constraint. The method of an embodiment includes scheduling the description by applying the scheduling solution to the description. The method of an embodiment includes providing timing information of the description as an output of the scheduling.

Embodiments described herein include a method running on a processor, the method comprising receiving a description of circuit behavior, wherein the description is un-timed. The method includes generating a scheduling solution for use in scheduling the description, the scheduling solution including scheduling variables and an objective function, the scheduling variables scheduling the time of at least one operation, the objective function including a penalty term and constraints comprising at least one hard constraint and at least one soft constraint, wherein the constraints are created on the scheduling variables, wherein the penalty term comprises a slack variable representing violations of the constraints, the penalty term measuring a design cost of violating the at least one soft constraint. The method includes scheduling the description by applying the scheduling solution to the description. The method includes providing timing information of the description as an output of the scheduling.

The objective function of an embodiment represents a design optimization goal of the description.

The method of an embodiment comprises creating the at least one hard constraint on the scheduling variables to implement a first set of attributes of the circuit behavior.

The first set of attributes of an embodiment comprises functional attributes of the circuit behavior.

The functional attributes of an embodiment include a data dependency constraint.

The functional attributes of an embodiment include an input protocol constraint.

The functional attributes of an embodiment include an output protocol constraint.

A first hard constraint of an embodiment does not conflict with a second hard constraint, wherein the at least one hard constraint comprises the first hard constraint and the second hard constraint.

The method of an embodiment comprises creating the at least one soft constraint on the scheduling variables to optimize a second set of attributes of the circuit behavior.

The second set of attributes of an embodiment comprises non-functional attributes of the circuit behavior including at least one of frequency, latency, throughput, area, resource, interconnection pattern and power.

The at least one soft constraint of an embodiment can be violated.

Each of the at least one soft constraints of an embodiment is realized as a class of penalty functions.

The method of an embodiment comprises evaluating a plurality of circuit behaviors by varying the penalty term for each of the at least one soft constraint.

The at least one soft constraint and the at least one hard constraint of an embodiment are based on the description and on the non-functional attributes of the circuit behavior.

The non-functional attributes of an embodiment include at least one of frequency, latency, throughput, area, resource, interconnection pattern, and power.

The method of an embodiment comprises optimizing the objective function and generating the scheduling solution.

The method of an embodiment comprises evaluating the scheduling solution to determine whether an additional scheduling solution is to be generated.

The method of an embodiment comprises generating the additional scheduling solution by evaluating whether a first set of soft constraints are to be modified using the scheduling solution and the description. The method of an embodiment comprises generating the additional scheduling solution by iteratively modifying the first set of soft constraints using the scheduling solution and the description. The method of an embodiment comprises generating the additional scheduling solution by iteratively generating the additional scheduling solution using the modified first set of soft constraints.

Embodiments described herein include a machine-readable medium including executable instructions which, when executed in a processing system, provide timing information of a description of circuit behavior by receiving the description of circuit behavior. The description of an embodiment is un-timed. The executable instructions of an embodiment generate a scheduling solution for use in scheduling the description. The scheduling solution includes scheduling variables and an objective function. The scheduling variables schedule the time of at least one operation. The objective function includes a penalty term and constraints comprising at least one hard constraint and at least one soft constraint. The constraints are created on the scheduling variables. The penalty term comprises a slack variable representing violations of the constraints. The penalty term measures a design cost of violating the at least one soft constraint. The executable instructions of an embodiment schedule the description by applying the scheduling solution to the description. The executable instructions of an embodiment provide the timing information of the description as an output of the scheduling.

Embodiments described herein include a machine-readable medium including executable instructions which, when executed in a processing system, provide timing information of a description of circuit behavior by receiving the description of circuit behavior, wherein the description is un-timed. The executable instructions generate a scheduling solution for use in scheduling the description, the scheduling solution including scheduling variables and an objective function, the scheduling variables scheduling the time of at least one operation, the objective function including a penalty term and constraints comprising at least one hard constraint and at least one soft constraint, wherein the constraints are created on the scheduling variables, wherein the penalty term comprises a slack variable representing violations of the constraints, the penalty term measuring a design cost of violating the at least one soft constraint. The executable instructions schedule the description by applying the scheduling solution to the description. The executable instructions provide the timing information of the description as an output of the scheduling.

Aspects of the systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the systems and methods include microcontrollers with memory (such as electronically erasable programmable read-only memory (EEPROM)), embedded microprocessors, firmware, software, etc. Furthermore, aspects of the systems and methods may be embodied in microprocessors having software-based circuit emulation, discrete logic (sequential and combinatorial), custom devices, fuzzy logic (in neural networks), quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that components of the various systems and methods disclosed herein may be described using computer aided design tools and expressed (or represented) as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof.

Examples of transfers of such formatted data and/or instructions by carrier waves include, but are not limited to, transfers (uploads, downloads, e-mail, etc.) over couplings or connections via one or more data transfer protocols (e.g., HTTP, FTP, SMTP, etc.). The couplings or connections supporting the transfers described above include wired couplings, wireless couplings, and hybrid wired/wireless couplings, but are not so limited. Furthermore, the couplings can include various networks and/or network components (not shown) of a communication service provider or carrier, but are not so limited. The network and corresponding network components, when present in the couplings, can be any of a number of network types known in the art including, but not limited to, local area networks (LANs), metropolitan area networks (MANs), wide area networks (WANs), proprietary networks, backend networks, and the Internet. When received within a computer system via one or more computer-readable media, such data and/or instruction-based expressions of the above described systems and methods may be processed by a processing entity (e.g., one or more processors) within the computer system in conjunction with execution of one or more other computer programs.

Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of embodiments of the systems and methods is not intended to be exhaustive or to limit the systems and methods described to the precise form disclosed. While specific embodiments of, and examples for, the systems and methods are described herein for illustrative purposes, various equivalent modifications are possible within the scope of other systems and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the embodiments to the specific embodiments disclosed in the specification and the claims, but should be construed to include all systems that operate under the claims. Accordingly, the embodiments are not limited by the disclosure, but instead the scope is to be determined entirely by the claims.

While certain aspects of the embodiments described herein are presented below in certain claim forms, the inventors contemplate the various aspects of the embodiments described above in any number of claim forms. Accordingly, the inventors reserve the right to add additional claims after filing the application to pursue such additional claim forms for other aspects of the embodiments described above.

What is claimed is:

1. A method running on a processor, the method comprising:
    receiving a description of circuit behavior, wherein the description is un-timed;
    generating, using a processor, a scheduling solution for use in scheduling the description, the scheduling solution including scheduling variables and an objective function, the scheduling variables scheduling the time of at least one operation, the objective function including a penalty term and constraints comprising at least one hard constraint and at least one soft constraint, wherein the constraints are created on the scheduling variables, wherein the penalty term comprises a slack variable representing violations of the constraints, the penalty term measuring a design cost of violating the at least one soft constraint;
    scheduling the description by applying the scheduling solution to the description; and
    providing timing information of the description as an output of the scheduling.

2. The method of claim 1, wherein the objective function represents a design optimization goal of the description.

3. The method of claim 1, comprising creating the at least one hard constraint on the scheduling variables to implement a first set of attributes of the circuit behavior.

4. The method of claim 3, wherein the first set of attributes comprises functional attributes of the circuit behavior.

5. The method of claim 4, wherein the functional attributes include a data dependency constraint.

6. The method of claim 4, wherein the functional attributes include an input protocol constraint.

7. The method of claim 4, wherein the functional attributes include an output protocol constraint.

8. The method of claim 3, wherein a first hard constraint does not conflict with a second hard constraint, wherein the at least one hard constraint comprises the first hard constraint and the second hard constraint.

9. The method of claim 1, comprising creating the at least one soft constraint on the scheduling variables to optimize a second set of attributes of the circuit behavior.

10. The method of claim 9, wherein the second set of attributes comprises non-functional attributes of the circuit behavior including at least one of frequency, latency, throughput, area, resource, interconnection pattern and power.

11. The method of claim 9, wherein the at least one soft constraint can be violated.

12. The method of claim 9, wherein each of the at least one soft constraint is realized as a class of penalty functions.

13. The method of claim 1, comprising evaluating a plurality of circuit behaviors by varying the penalty term for each of the at least one soft constraint.

14. The method of claim 1, wherein the at least one soft constraint and the at least one hard constraint are based on the description and on the non-functional attributes of the circuit behavior.

15. The method of claim 14, wherein the non-functional attributes include at least one of frequency, latency, throughput, area, resource, interconnection pattern, and power.

16. The method of claim 1, comprising optimizing the objective function and generating the scheduling solution.

17. The method of claim 1, comprising evaluating the scheduling solution to determine whether an additional scheduling solution is to be generated.

18. The method of claim 17, comprising generating the additional scheduling solution by:
    evaluating whether a first set of soft constraints are to be modified using the scheduling solution and the description;
    iteratively modifying the first set of soft constraints using the scheduling solution and the description; and
    iteratively generating the additional scheduling solution using the modified first set of soft constraints.

19. A non-transitory machine-readable medium including executable instructions which, when executed in a processing system, provides timing information of a description of circuit behavior by:
    receiving the description of circuit behavior, wherein the description is un-timed;
    generating a scheduling solution for use in scheduling the description, the scheduling solution including scheduling variables and an objective function, the scheduling variables scheduling the time of at least one operation, the objective function including a penalty term and con straints comprising at least one hard constraint and at least one soft constraint, wherein the constraints are created on the scheduling variables, wherein the penalty term comprises a slack variable representing violations of the constraints, the penalty term measuring a design cost of violating the at least one soft constraint;

scheduling the description by applying the scheduling solution to the description; and providing the timing information of the description as an output of the scheduling.

* * * * *